United States Patent
Boni et al.

(10) Patent No.: US 11,353,694 B2
(45) Date of Patent: Jun. 7, 2022

(54) MICROELECTROMECHANICAL MIRROR DEVICE WITH PIEZOELECTRIC ACTUATION, HAVING AN IMPROVED STRUCTURE

(71) Applicant: STMicroelectronics S.r.l., Agrate Brianza (IT)

(72) Inventors: Nicolo' Boni, Alzano Lombardo (IT); Roberto Carminati, Piancogno (IT); Massimiliano Merli, Pavia (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 17/121,961

(22) Filed: Dec. 15, 2020

(65) Prior Publication Data
US 2021/0191107 A1   Jun. 24, 2021

(30) Foreign Application Priority Data
Dec. 18, 2019   (IT) .......... 102019000024469

(51) Int. Cl.
*G03B 21/28*   (2006.01)
*G02B 26/08*   (2006.01)
(Continued)

(52) U.S. Cl.
CPC ........ *G02B 26/0858* (2013.01); *B81B 3/0083* (2013.01); *G02B 26/105* (2013.01);
(Continued)

(58) Field of Classification Search
CPC .... G03B 21/008; G03B 21/28; G03B 21/145; G02B 26/02; G02B 26/0858;
(Continued)

(56) References Cited

U.S. PATENT DOCUMENTS 9,105,834 B2 * 8/2015 Davis ................ H01L 41/047
2017/0160540 A1   6/2017 Giusti et al.
(Continued)

FOREIGN PATENT DOCUMENTS

WO   2010113602 A1   10/2010

OTHER PUBLICATIONS

IT Search Report and Written Opinion for IT Appl. No. 102019000024469 dated Sep. 7, 2020 (9 pages).

*Primary Examiner* — Sultan Chowdhury
(74) *Attorney, Agent, or Firm* — Crowe & Dunlevy

(57) ABSTRACT

A microelectromechanical mirror device has a fixed structure defining a cavity. A tiltable structure carrying a reflecting surface is elastically suspended above the cavity with a main extension in a horizontal plane. Elastic elements are coupled to the tiltable structure and at least one first pair of driving arms, which carry respective regions of piezoelectric material, are biasable to cause rotation of the tiltable structure about at least one first axis of rotation parallel to a first horizontal axis of the horizontal plane. The driving arms are elastically coupled to the tiltable structure on opposite sides of the first axis of rotation and are interposed between the tiltable structure and the fixed structure. The driving arms have a thickness, along an orthogonal axis transverse to the horizontal plane, smaller than a thickness of at least some of the elastic elements coupled to the tiltable structure.

21 Claims, 5 Drawing Sheets

(51) Int. Cl.
    *B81B 3/00*     (2006.01)
    *G02B 26/10*    (2006.01)
    *G03B 21/00*    (2006.01)

(52) U.S. Cl.
    CPC ........... *G03B 21/008* (2013.01); *G03B 21/28* (2013.01); *B81B 2201/042* (2013.01)

(58) Field of Classification Search
    CPC .... G02B 26/266; G02B 26/4214; B81B 3/00; B81B 3/0002; B81B 3/0013; B81B 3/0018; B81B 3/0035; B81B 3/0043; B81B 3/0083; B81B 2201/04; B81B 2201/042; B81B 2201/045; B81B 2201/13
    See application file for complete search history.

(56) References Cited

U.S. PATENT DOCUMENTS

| | | |
|---|---|---|
| 2018/0031823 A1 | 2/2018 | Carminati et al. |
| 2018/0095356 A1* | 4/2018 | Kimura ................ H04N 9/3155 |
| 2018/0180871 A1* | 6/2018 | Costantini ........... B81C 1/00714 |

* cited by examiner

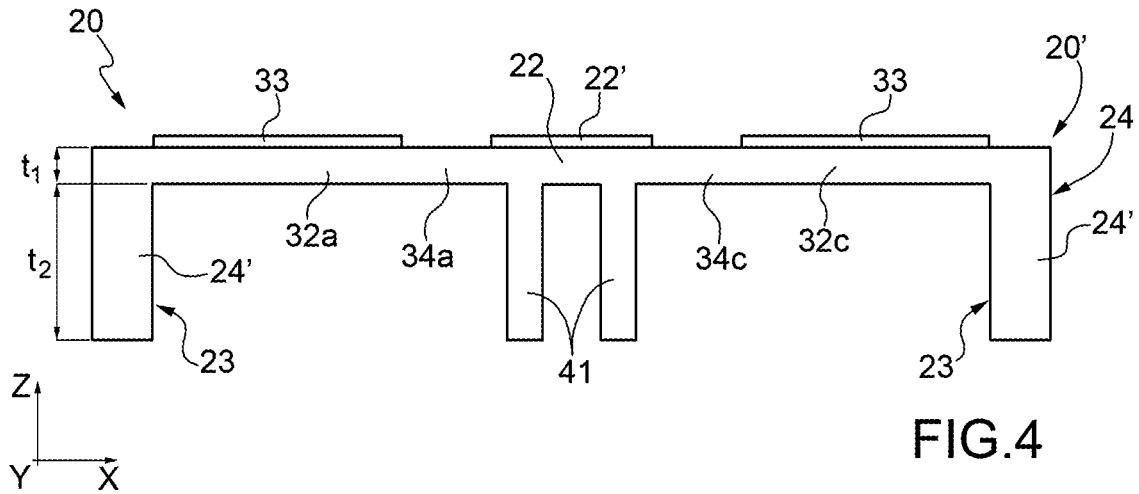
FIG.4
(Prior Art)
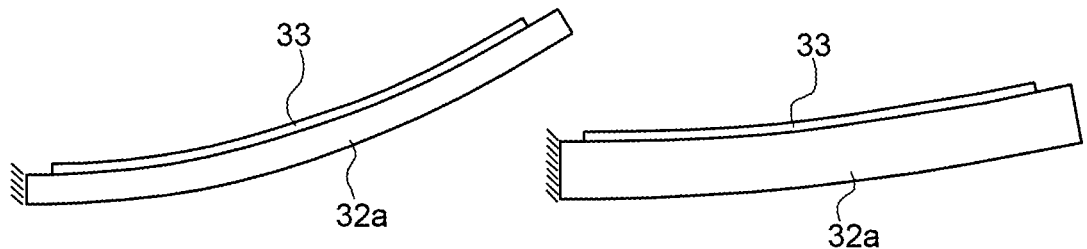
FIG.5A
(Prior Art)
FIG.5B
(Prior Art)
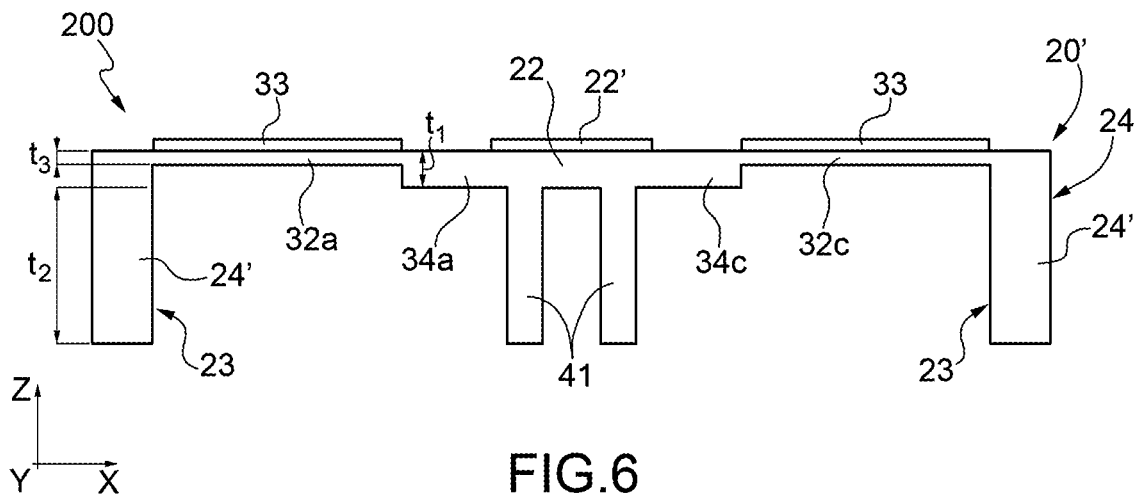
FIG.6

MICROELECTROMECHANICAL MIRROR DEVICE WITH PIEZOELECTRIC ACTUATION, HAVING AN IMPROVED STRUCTURE

PRIORITY CLAIM

This application claims the priority benefit of Italian Application for Patent No. 102019000024469, filed on Dec. 18, 2019, the contents of which are hereby incorporated by reference in their entirety to the maximum extent allowable by law.

TECHNICAL FIELD

This disclosure relates to a microelectromechanical mirror device, made with MEMS (Micro-Electro-Mechanical System) technology, utilizing piezoelectric actuation and having an improved structure.

BACKGROUND

As is known, microelectromechanical mirror devices are used in portable apparatuses, such as smartphones, tablets, notebooks, and PDAs, for optical applications, in particular for directing beams of light radiation generated by a light source (for example, a laser source) according to desired patterns. Thanks to the small size, these devices allow the meeting of stringent limitations regarding the occupation of space, in terms of area and thickness.

For instance, microelectromechanical mirror devices are used in miniaturized projector apparatuses (so-called picoprojectors), which are configured to project images at a distance and generate desired light patterns.

Microelectromechanical mirror devices generally include a tiltable structure that carries a suitable reflecting surface, elastically supported above a cavity and obtained starting from a body of semiconductor material so as to be movable, for example with a movement of inclination or rotation out of a corresponding plane of main extension, to direct the incident light beam in a desired manner.

Typically, a deviation of the light beam is required along two axes, which can be obtained by using two microelectromechanical mirror devices of a uniaxial type, or else by a single microelectromechanical mirror device of a biaxial type.

FIG. 1A is a schematic illustration of a picoprojector 1 comprising a light source 2, typically a laser source, which generates a beam of light that is deflected by a mirror arrangement 3 towards a screen 4.

In the example illustrated schematically in the aforesaid FIG. 1A, the mirror arrangement 3 comprises: a first mirror device 3a, of a uniaxial type, driven to rotate about a first axis A with a resonance movement, for generating a fast horizontal scan; and a second mirror device 3b, which is also of a uniaxial type, driven to rotate about a second axis B with a linear or quasi-static movement (i.e., at a frequency much lower than the frequency of the resonance movement), for generating a slow vertical scan, for example of a sawtooth type.

The first and second mirror devices 3a, 3b co-operate for generating on the screen 4 a scanning pattern, which is illustrated schematically and designated by 5 in FIG. 1A. In particular, the first mirror device 3a, as it rotates about the first axis A, "draws" a horizontal line on the second mirror device 3b; and the second mirror device 3b, as it rotates about the second axis B, directs the projection onto a desired rectangular surface of the screen 4.

Alternatively, as illustrated schematically in FIG. 1B, the mirror arrangement 3 of the picoprojector 1 may comprise a single mirror device, designated by 3c, of a biaxial type, i.e., controlled to rotate both about the first axis A with resonance movement and about the second axis B with linear movement.

Rotation of the mirror device is controlled by an actuation system that may be of an electrostatic, electromagnetic, or piezoelectric type.

Electrostatic actuation systems in general have the disadvantage of requiring high operating voltages, whereas electromagnetic actuation systems in general involve high power consumption.

It has thus been proposed to control the scanning movement, in particular at least the linear quasi-static movement about the second axis B, with piezoelectric actuation. A similar actuation system is able to control rotation about the first axis A so as to also control the horizontal scan.

For instance, a mirror device with piezoelectric actuation is described in U.S. Pat. No. 10,175,474 (corresponding to EP 3,178,783A1), the contents of which are incorporated by reference.

This mirror device has: a tiltable structure, rotatable about the second axis B; a fixed structure; and an actuation structure of a piezoelectric type, coupled between the tiltable structure and the fixed structure. The actuation structure is formed by spring elements that have a spiral shape. The spring elements are each formed by a plurality of driving arms that extend in a direction transverse to the second axis B, each driving arm carrying a respective piezoelectric band of piezoelectric material. The driving arms are divided into two groups driven in phase opposition to obtain rotation of the tiltable structure in opposite directions about the second axis B.

FIGS. 2A-2B are schematic illustrations of a portion of a mirror device, designated by reference numeral 10, according to the teachings of the aforesaid document U.S. Pat. No. 10,175,474 (corresponding to EP 3,178,783A1). Illustrated by way of example are just one first driving arm 11a and one second driving arm 11b belonging to the aforesaid two groups driven in phase opposition, and application of a biasing voltage V to just one of the aforesaid driving arms (in the example, the first driving arm 11a) is shown.

The first driving arm 11a has a first end connected to the second driving arm 11b and a second end connected to the tiltable structure 12, which carries a mirror surface 13, at a corresponding end portion or edge portion.

As illustrated in FIG. 2B, application of the biasing voltage V causes bending out of the horizontal plane (along an orthogonal axis z) of the first driving arm 11a and in particular of the second end connected to the tiltable structure 12. Consequently, the same tiltable structure 12 also undergoes a corresponding displacement out of the plane.

Given that the amount of displacement out of the plane of the tiltable structure 12 is substantially equal to the overall bending of the driving arms, the spring elements have a folded spiral shape, with a plurality of driving arms, in such a way as to jointly maximize the amount of displacement.

The mirror devices with piezoelectric actuation have the advantage of requiring lower actuation voltages and having lower levels of power consumption as compared to devices with electrostatic or electromagnetic actuation.

However, it is noted that known approaches for mirror devices with piezoelectric actuation generally have a high sensitivity to spurious movements out of the plane (along the orthogonal axis z). The driving arms, on which the piezoelectric bands are provided, have in fact a considerable length and a small thickness (as mentioned previously, in order to achieve high values of displacement), in this way causing the presence of multiple spurious modes even at low frequencies (i.e., at frequencies close to the frequency of the driving movement, for example at around 100 Hz).

In addition, once again due to the length of the driving arms (arranged in folded configuration), the structure proves particularly subject to shocks along the z axis.

As such, further development efforts are needed to provide a microelectromechanical mirror device with actuation of a piezoelectric type having improved characteristics that will enable the drawbacks of the prior art to be overcome.

SUMMARY

Embodiments herein relate to a microelectromechanical mirror device including: a fixed structure defining a cavity; a tiltable structure carrying a reflecting surface, elastically suspended above the cavity and having a main extension in a horizontal plane; elastic elements coupled to the tiltable structure; and at least one first pair of driving arms, carrying respective regions of piezoelectric material, to be biased to cause rotation of the tiltable structure about at least one first axis of rotation parallel to a first horizontal axis of the horizontal plane, elastically coupled to the tiltable structure and interposed between the tiltable structure and the fixed structure. The driving arms have, along an orthogonal axis transverse to the horizontal plane, a thickness smaller than that of at least some of the elastic elements coupled to the tiltable structure.

At least some of the elastic elements may have a first thickness. The fixed structure may have a thickness greater, by a value equal to a second thickness, than the first thickness, and the driving arms may have a third thickness along the orthogonal axis. The third thickness may be smaller than, and the second thickness may be greater than, the first thickness.

The first thickness may be between 10 μm and 50 μm, the third thickness may be less than 20 μm, and the second thickness may be greater than 50 μm.

The tiltable structure may have underneath, on a surface opposite to the reflecting surface, a reinforcement structure, having the function of mechanical reinforcement. The reinforcement structure may have the second thickness along the orthogonal axis.

The tiltable structure may have the first thickness along the orthogonal axis.

The tiltable structure may have the third thickness along the orthogonal axis.

The first, second, and third thicknesses may be defined in a same die of semiconductor material.

The remaining elastic elements coupled to the tiltable structure, different from at least some of the elastic elements, may have the third thickness.

In some instances, all the elastic elements coupled to the tiltable structure may have the first thickness.

The elastic elements may include: elastic decoupling elements, which couple the tiltable structure to the driving arms on opposite sides and in the proximity of the first axis of rotation and are rigid with respect to movements out of the horizontal plane and compliant to torsion about an axis parallel to the first axis of rotation; and elastic suspension elements, which elastically couple the tiltable structure to the fixed structure at the first axis of rotation and are rigid with respect to movements out of the horizontal plane and compliant to torsion about the first axis of rotation, the elastic suspension elements extending along the first axis of rotation, between a central portion of opposite sides of the tiltable structure and the fixed structure.

The elastic decoupling elements may be coupled to the tiltable structure at the first axis of rotation, and the driving arms may have a first end elastically coupled to the tiltable structure by the respective elastic decoupling elements and a second end, longitudinally opposite to the first end, fixedly coupled to the fixed structure.

The fixed structure may define, in the horizontal plane, a frame that delimits and surrounds the cavity, and moreover may have a first supporting element and a second supporting element, which extend longitudinally along the first axis of rotation within the cavity starting from the frame, on opposite sides of the tiltable structure. The elastic suspension elements may extend between the tiltable structure and a respective one of the first and second supporting elements.

A second pair of driving arms may be arranged in a way symmetrical to the first pair of driving arms with respect to a second horizontal axis of the horizontal plane, orthogonal to the first horizontal axis. The driving arms of the second pair may carry respective regions of piezoelectric material and be elastically coupled to the tiltable structure on opposite sides and in the proximity of the first axis of rotation by respective elastic decoupling elements, rigid with respect to movements out of the horizontal plane and compliant to torsion about the first axis of rotation.

Also disclosed herein is a picoprojector apparatus, including the microelectromechanical mirror device according to any of the descriptions above.

The picoprojector apparatus may be used in a portable electronic apparatus, that also includes: a light source, operable for generating a light beam as a function of an image to be generated; and a driving circuit configured to provide electrical driving signals for causing rotation of the tiltable structure.

BRIEF DESCRIPTION OF THE DRAWINGS

For a better understanding, embodiments are now described, purely by way of non-limiting example, with reference to the attached drawings, wherein:

FIG. 4 is a schematic cross-sectional view of the microelectromechanical mirror device of FIG. 3;

FIGS. 5A-5B are schematic illustrations of the vertical displacement of a driving arm of the microelectromechanical mirror device of FIG. 3, for different thicknesses of the same driving arm;

FIG. 6 is a schematic cross-sectional view of a microelectromechanical mirror device, according to an embodiment disclosed and described herein;

DETAILED DESCRIPTION

Figure 3:
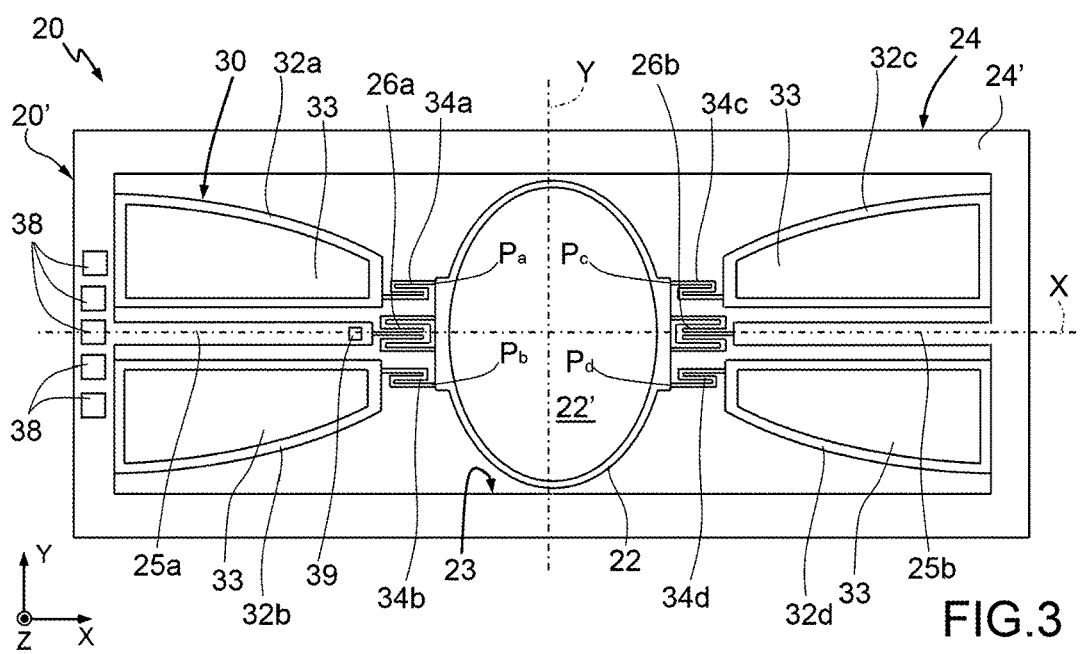
FIG. 3 is a schematic top view of a further microelectromechanical mirror device of a known type.

FIG. 3 is a schematic illustration of a microelectromechanical mirror device 20, based on MEMS technology, which is described in United States Patent Application Publication No. 20200192199 corresponding to European Patent Application No. 19165958.0, filed on Mar. 28, 2019, the contents of which are incorporated by reference.

Figure 1A:
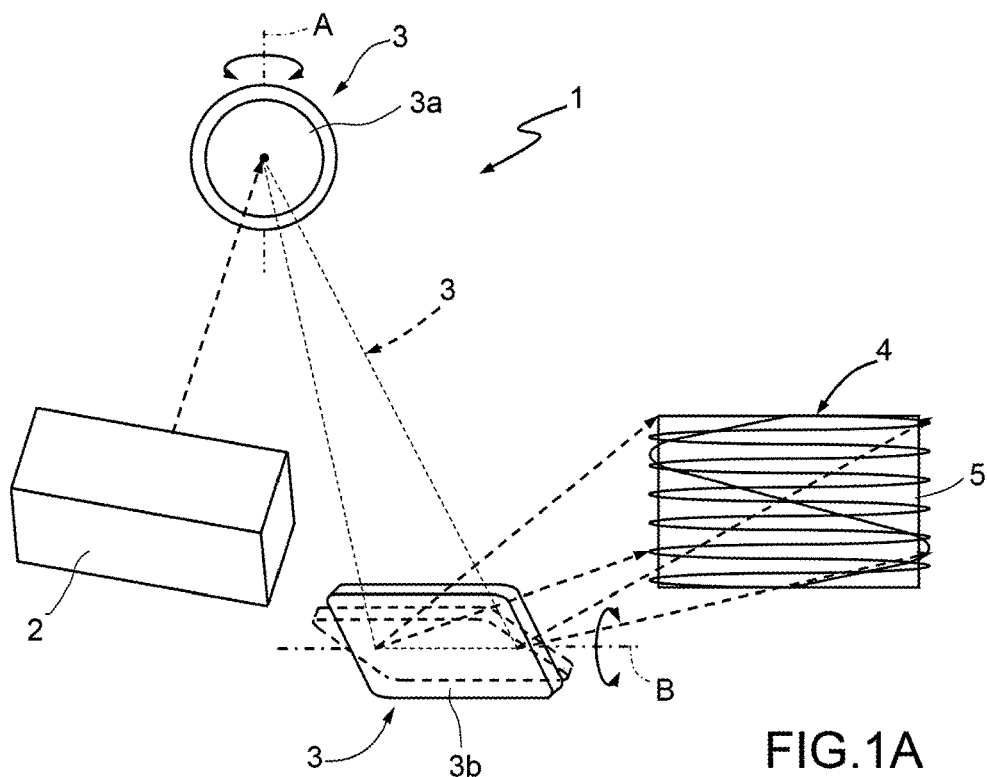
FIGS. 1A-1B are schematic illustrations of respective prior art picoprojectors, having a pair of uniaxial mirror devices or a single biaxial mirror device.

The microelectromechanical device 20 is formed in a die 20' of semiconductor material, in particular silicon, and has a tiltable structure 22, having a main extension in a horizontal plane xy and arranged so as to rotate about a first axis of rotation, parallel to a first horizontal axis x of the aforesaid horizontal plane xy (for example, the first axis of rotation corresponds to the B rotation axis of a picoprojector apparatus, see FIG. 1A).

The aforesaid first axis of rotation represents a first median axis of symmetry X for the microelectromechanical device 20. A second median axis of symmetry Y for the microelectromechanical device 20 is parallel to a second horizontal axis y, which is orthogonal to the first horizontal axis x and defines, with the first horizontal axis x, the horizontal plane xy.

The tiltable structure 22 is suspended above a cavity 23, formed in the die 20' and has, in the embodiment illustrated, a generically elliptical shape in the horizontal plane xy, with its major axis arranged along the second median axis of symmetry Y. The tiltable structure 22 defines a supporting structure, which carries at the top a reflecting surface 22' so as to define a mirror structure.

The tiltable structure 22 is elastically coupled to a fixed structure 24, defined in the die 20'. In particular, the fixed structure 24 forms, in the horizontal plane xy, a frame 24' that delimits and surrounds the aforesaid cavity 23 and moreover has a first supporting element 25a and a second supporting element 25b, which extend longitudinally along the first median axis of symmetry X within the cavity 23 starting from the frame 24', on opposite sides of the tiltable structure 22.

The tiltable structure 22 is supported by the first and second supporting elements 25a, 25b, to which it is elastically coupled, respectively, by a first elastic suspension element 26a and a second elastic suspension element 26b, having a high stiffness in regard to movements out of the horizontal plane xy (along an orthogonal axis z, transverse to the horizontal plane xy) and being compliant to torsion about the first horizontal axis x. The first and second elastic suspension elements 26a, 26b therefore extend along the first median axis of symmetry X, between the first and second supporting elements 25a, 25b, respectively, and facing a side of the tiltable structure 22, to which they are coupled at a corresponding central portion.

In the embodiment illustrated, the first and second elastic suspension elements 26a, 26b are of a linear type (but may, alternatively, be of a folded type).

The first and second elastic suspension elements 26a, 26b couple the tiltable structure 22 to the fixed structure 24, enabling rotation thereof about the first axis of rotation and providing a high stiffness in regard to movements out of the plane, therefore helping provide a high ratio between the frequencies of spurious movements out of the horizontal plane xy and the frequency of rotation about the first axis of rotation.

The microelectromechanical device 20 further comprises an actuation structure 30, coupled to the tiltable structure 22 and configured to cause rotation thereof about the first axis of rotation. The actuation structure 30 is interposed between the tiltable structure 22 and the fixed structure 24 and moreover contributes to supporting the tiltable structure 22 above the cavity 23.

The actuation structure 30 comprises a first pair of driving arms formed by a first driving arm 32a and a second driving arm 32b, which are arranged on opposite sides of, and symmetrically with respect to, the first median axis of symmetry X and the first supporting element 25a, and have a longitudinal extension parallel to the first horizontal axis x and to the aforesaid first supporting element 25a.

In the embodiment illustrated in FIG. 3, the driving arms 32a, 32b have a generically trapezoidal (or finlike) shape, with the major side directed parallel to the second horizontal axis y fixedly coupled to the frame 24' of the fixed structure 24 and the minor side oriented parallel to the second horizontal axis y elastically coupled to the tiltable structure 22. Each driving arm 32a, 32b therefore has a respective first end fixedly coupled to the frame 24' of the fixed structure 24 and a respective second end elastically coupled to the tiltable structure 22, by a respective first elastic decoupling element 34a and a respective second elastic decoupling element 34b.

Each driving arm 32a, 32b is suspended above the cavity 23 and carries, at a top surface thereof (opposite to the cavity 23) a respective piezoelectric structure 33 (for example, of PZT—Lead Zirconate Titanate), having substantially the same extension in the horizontal plane xy as the driving arm 32a, 32b.

The piezoelectric structure 33 (in a way not illustrated in detail) is formed by a superposition of: a bottom electrode region, of an appropriate conductive material, arranged on top of the corresponding driving arm 32a, 32b; a region of piezoelectric material (for example, constituted by a thin film of PZT) arranged on the aforesaid bottom electrode region; and a top electrode region arranged on the region of piezoelectric material.

The aforesaid first and second elastic decoupling elements 34a, 34b have a high stiffness in regard to movements out of the horizontal plane xy (along the orthogonal axis z) and are compliant to torsion (about an axis of rotation parallel to the first horizontal axis x). The first and second elastic decoupling elements 34a, 34b therefore extend parallel to the first horizontal axis x, between the first and second driving arms 32a, 32b, respectively, and face a same side of the tiltable structure 22.

In particular, as also illustrated in the aforesaid FIG. 3, the first and second elastic decoupling elements 34a, 34b are coupled to the tiltable structure 22 at a respective coupling point Pa, Pb, which is in the proximity of the first median axis of symmetry X, at a small distance d from the same first median axis of symmetry X. For instance, this distance d may be in the range between 10 μm and 1500 μm in a typical embodiment and can also be in general between ⅟10 and ½ of the main dimension (in the example, along the second median axis of symmetry Y) of the tiltable structure 22.

In any case, the distance between the respective coupling point Pa, Pb and the first median axis of symmetry X is preferably less, in particular much less, than the distance between the same coupling point Pa, Pb and end or edge portions (considered along the second median axis of symmetry Y) of the tiltable structure 22. In fact, the closer the coupling points Pa, Pb are to the first axis of rotation, the greater the ratio between the vertical displacement of the end of the tiltable structure 22 and the vertical displacement of the driving arms 32a, 32b due to the piezoelectric effect.

In the embodiment illustrated in FIG. 3, the first and second elastic decoupling elements 34a, 34b are of a folded type, i.e., they are formed by a plurality of arms that have a longitudinal extension parallel to the first horizontal axis x, connected two by two by connection elements that have an extension parallel to the second horizontal axis y (in a different embodiment, the elastic decoupling elements 34a, 34b may alternatively be of a linear type).

The aforesaid actuation structure 30 further comprises a second pair of driving arms formed by a third driving arm 32c and a fourth driving arm 32d, which are arranged on opposite sides with respect to the first median axis of symmetry X and, this time, to the second supporting element 25b and have a longitudinal extension parallel to the first horizontal axis x and to the aforesaid second supporting element 25b (it should be noted that the second pair of driving arms 32c, 32d is therefore arranged in a way symmetrical to the first pair of driving arms 32a, 32b with respect to the second median axis of symmetry Y).

As discussed for the first pair of driving arms 32a, 32b, each driving arm 32c, 32d of the second pair carries, at a top surface thereof, a respective piezoelectric structure 33 (for example, of PZT) and has a respective first end fixedly coupled to the frame 24' of the fixed structure 24 and a respective second end elastically coupled to the tiltable structure 22 by a third elastic decoupling element 34c and, respectively, of a fourth elastic decoupling element 34d (which are arranged opposite to the first and second elastic decoupling elements 34a, 34b with respect to the second median axis of symmetry Y).

The aforesaid third and fourth elastic decoupling elements 34c, 34d also have a high stiffness in regard to movements out of the horizontal plane xy (along the orthogonal axis z) and are compliant to torsion (about an axis of rotation parallel to the first horizontal axis x).

In particular, as also illustrated in the aforesaid FIG. 3, the third and fourth elastic decoupling elements 34c, 34d are therefore coupled to the tiltable structure 22 at a respective coupling point Pc, Pd, which is in the proximity of the first axis of rotation, at the small distance d from the same first axis of rotation. In addition, also the third and fourth elastic decoupling elements 34c, 34d are of a folded type.

The microelectromechanical device 20 further comprises a plurality of electrical contact pads 38, carried by the fixed structure 24 at the frame 24', electrically connected (in a way not illustrated in detail in FIG. 3) to the piezoelectric structures 33 of the driving arms 32a-32d, to enable electrical biasing thereof by electrical signals coming from the outside of the microelectromechanical device 20 (for example, supplied by a biasing device of an electronic apparatus in which the microelectromechanical device 20 is integrated).

Moreover, the microelectromechanical device 20 comprises a piezoresistive (PZR) sensor 39, appropriately provided to generate a sensing signal associated to rotation of the tiltable structure 22 about the first axis of rotation. This sensing signal may be supplied as a feedback at the output from the microelectromechanical device 20, for example to the aforesaid biasing device, through at least one of the electrical-contact pads 38.

In the embodiment illustrated in FIG. 3, the aforesaid piezoresistive sensor 39 is obtained (for example, by surface diffusion of dopant atoms) in a position corresponding to the first supporting element 25a (different arrangements may, however, be contemplated for the same piezoresistive sensor 39).

Advantageously, the elastic suspension elements 26a, 26b are able to transmit stresses to the supporting elements 25a, 25b and therefore toward the piezoresistive sensor 39, enabling arrangement of the latter in the area of the supporting elements 25a, 25b and consequent simplification of routing of the electrical connections toward the electrical-contact pads 38.

During operation of the microelectromechanical device 20, application of a biasing voltage V to the piezoelectric structure 33 of the first driving arm 32a (having a positive value with respect to biasing of the piezoelectric structure 33 of the second driving arm 32b, which may, for example, be connected to a ground reference potential), causes a rotation of a positive angle about the first axis of rotation (parallel to the first horizontal axis x).

In a corresponding manner, application of a biasing voltage V to the piezoelectric structure 33 of the second driving arm 32b (having a positive value with respect to biasing of the piezoelectric structure 33 of the first driving arm 32a, which may, for example, in this case, be connected to a ground reference potential), causes a corresponding rotation of a negative angle about the same first axis of rotation.

It should be noted that the aforesaid biasing voltage V is applied to the piezoelectric structure 33 of both the first driving arm 32a and the third driving arm 32c, and, likewise, in order to cause an opposite rotation, to the piezoelectric structure 33 of both the second driving arm 32b and the fourth driving arm 32d so as to contribute to rotation of the tiltable structure 22 about the first axis of rotation (as will be clear from the foregoing description).

The elastic decoupling elements 34a-34d elastically decouple the displacement, by the piezoelectric effect, of the driving arms 32a-32d along the orthogonal axis z from the consequent rotation of the tiltable structure 22 along the first axis of rotation.

In particular, by virtue of the proximity to the axis of rotation of the coupling points Pa-Pd between the elastic decoupling elements 34a-34d and the tiltable structure 22, a wide angle of rotation of the tiltable structure 22 about the first axis of rotation, or, likewise, a large displacement out of the horizontal plane xy of the end portions (considered along the second horizontal axis y) of the tiltable structure 22, correspond to a small displacement out of the horizontal plane xy of the aforesaid driving arms 32a-32d; for example, the ratio between the amount of the above displacements may be equal to five in a possible embodiment.

The tiltable structure 22 may achieve wide angles of inclination (for example, greater than 10°) in response to a low value of the biasing voltage V (for example, less than 40 V).

In addition, a maximum degree of stress occurs in the elastic suspension elements 26a, 26b, which couple the tiltable structure 22 to the fixed structure 24.

The first spurious mode, due to movement out of the plane of the tiltable structure 22, has a frequency that is much higher than the frequency of the main mode, represented by the rotation about the first axis of rotation (for example, the ratio between the two frequencies is higher than four), unlike different known solutions where the same frequencies have comparable values.

Furthermore, also by virtue of the small displacement of the driving arms 32a-32d in the direction of the orthogonal axis z (this displacement being reduced even by a factor of ten with respect to different traditional solutions), the microelectromechanical device 20 is less subject to shock acting along the same orthogonal axis z (in other words, a same shock causes a level of stress and a displacement out of the horizontal plane xy much smaller in the microelectromechanical device 20 than in different known solutions).

FIG. 4 shows a schematic cross-sectional view of the microelectromechanical device 20 described in the aforesaid United States Patent Application Publication No. 20200192199 corresponding to European Patent Application No. 19165958.0.

In particular, this sectional view (parallel to the first horizontal axis x) shows how the thickness (along the orthogonal axis z) of the elastic decoupling elements 34a-34d (and, in a way not illustrated, also of the elastic suspension elements 26a, 26b) is equal to the thickness of the driving arms 32a-32d and moreover corresponds to the thickness of the tiltable structure 22. This thickness is referred to as "first thickness $t_1$" and is, for example, equal to 20 µm.

A reinforcement structure 41 is coupled below the above tiltable structure 22, having the function of mechanical reinforcement for the same tiltable structure 22 (and moreover designed to guarantee flatness thereof in the horizontal plane xy, in resting conditions); the reinforcement structure 41 has a second thickness $t_2$ along the orthogonal axis z, greater than the first thickness $t_1$, for example being equal to 140 µm. The reinforcement structure 41 may have a ring conformation and is set along the periphery of the tiltable structure 22.

The fixed structure 24 of the microelectromechanical device 20 (in particular, the corresponding frame 24' and the supporting elements 25a, 25b) has, along the orthogonal axis z, a thickness substantially equal to the sum of the aforesaid first and second thicknesses $t_1$ and $t_2$ (or, in other words, is thicker than the first thickness $t_1$ by a value equal to the second thickness $t_2$).

It will be noted that the structure of the microelectromechanical device 20 described previously, albeit advantageous from many standpoints, is not altogether optimized.

In particular, as illustrated schematically in FIGS. 5A and 5B, the amount of displacement Δz along the orthogonal axis z of the driving arms (illustrated by way of example is the driving arm 32a) and therefore of the tiltable structure 22, given a same extension of the piezoelectric structures 33 and a same biasing voltage V applied, is a function of the thickness of the material underlying the same piezoelectric structures 33 (i.e., the thickness of the driving arms 32a-32d). Corresponding to a smaller thickness (FIG. 5A) is a greater displacement Δz as compared to the case where the thickness is greater (FIG. 5B). In other words, the presence of a thick layer of material under the piezoelectric regions 33 entails a lower efficiency of the microelectromechanical mirror device 20.

At the same time, however, the thickness along the orthogonal axis z is parameter of note for ensuring robustness in regard to shocks along the same orthogonal axis z.

In particular, it is helpful for the thickness of the elastic elements coupled to the tiltable structure 22 (especially of the elastic suspension elements 26a, 26b, but also of the elastic decoupling elements 34a-34d) to not be reduced beyond a certain value to help provide a sufficient robustness in regard to the aforesaid shocks along the orthogonal axis z (considering that a robustness to shocks for example greater than 1100 g may be required). In addition, it is helpful to not reduce the thickness of the tiltable structure 22 excessively, since there may otherwise be problems related to flatness.

It is therefore evident that in the structure of the microelectromechanical device 20, described previously with reference to FIG. 4, a compromise is desired between the desired reduction in thickness of the driving arms 32a-32d (which is desired in order to increase the displacement Δz and therefore the efficiency) and the desired increase in the thickness of the elastic elements coupled to the tiltable structure 22 (which is desired in order to increase the robustness).

Furthermore, given that the thickness of the driving arms 32a-32d cannot be reduced beyond a certain value (in order not to jeopardize the robustness of the microelectromechanical device 20), the length of the same driving arms 32a-32d (in FIG. 3, along the first horizontal axis x) has to be sufficiently high (for example, equal to 11 mm) to help ensure the desired displacement Δz (and the desired scanning deviation of the light beam by the microelectromechanical mirror device 20).

Consequently, it may not be possible to reduce the size of the die 20' of the microelectromechanical device 20 beyond a certain bottom limit, contrary to what would be desirable (it is to be recalled that the reduction in size of the die 20' is a desired parameter for this kind of MEMS devices).

Based on the above considerations, as illustrated schematically in FIG. 6, an aspect described herein therefore envisages providing a microelectromechanical mirror device 200 (which, otherwise, has a structure substantially equivalent to that of the microelectromechanical device 20 of FIG. 3), but modified so that the driving arms carrying the piezoelectric material regions have a thickness different from that of the elastic elements, thereby independently optimizing the respective values of thickness to meet the contrasting criteria of efficiency and robustness optimization.

In detail, in the embodiment illustrated in the aforesaid FIG. 6, the driving arms 32a-32d therefore have a third thickness $t_3$, different from the first thickness $t_1$ of the elastic elements (in FIG. 6 the elastic decoupling elements 34a, 34c are shown by way of example), in particular less than the same first thickness $t_1$.

In the same embodiment, also the tiltable structure 22 has the first thickness $t_1$ (i.e., a thickness equal to that of the elastic elements).

Moreover, the reinforcement structure 41 coupled underneath the tiltable structure 22 has, in this case, the second thickness $t_2$, which is here greater than both the first thickness $t_1$ and the third thickness $t_3$, and the fixed structure 24 (in particular, the corresponding frame 24') has, in this case, a thickness substantially equal to the sum of the first and second thicknesses $t_1$, $t_2$.

In a possible embodiment of the microelectromechanical mirror device 200, the first thickness $t_1$ is comprised between 10 µm and 50 µm (for example, 20 µm), the third thickness $t_3$ is less than 20 µm (for example, between 1 µm and 20 µm, as a particular example equal to 5 µm); and the second thickness $t_2$ is greater than 50 µm (for example, 140 µm).

In a way not illustrated in the aforesaid FIG. 6, according to an aspect, the elastic suspension elements 26a-26b are made so as to have the first thickness $t_1$.

In a different embodiment, the elastic decoupling elements 34a-34d may be obtained so as to have the third thickness $t_3$, i.e., a thickness equal to that of the driving arms 32a-32d.

In a further variant, the tiltable structure 22 may also have the third thickness $t_3$ (i.e., a thickness equal to that of the aforesaid driving arms 32a-32d); also in this case, the reinforcement structure 41 may have the aforesaid second thickness $t_2$.

Advantageously, the small thickness of the driving arms 32a-32d enables, given the same dimensions and biasing voltage V applied, an increase in the efficiency of the microelectromechanical mirror device 200 (increasing the displacement Δz along the orthogonal axis z of the same driving arms 32a-32d), or, alternatively, once again given the same biasing voltage V applied, it is possible to obtain similar levels of performance with smaller dimensions.

In this regard, it is noted that the possibility of reducing the length of the driving arms 32a-32d, obtaining a consequent reduction of the overall dimensions of the die 20' of approximately 35% (as compared to a known solution, described with reference to FIG. 4). The reduction in area of the regions of piezoelectric material, in the example a reduction of approximately 55%, moreover enables a reduction in power consumption.

Figure 7A:
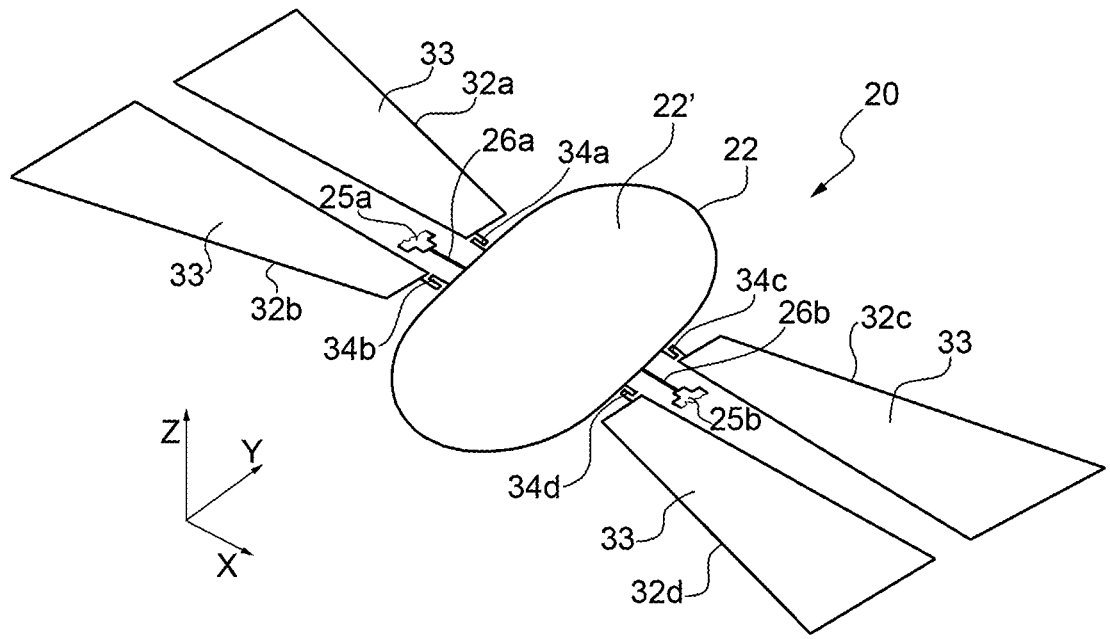
FIG. 7A is a schematic top view of the known microelectromechanical mirror device of FIG. 4.
Figure 7B:
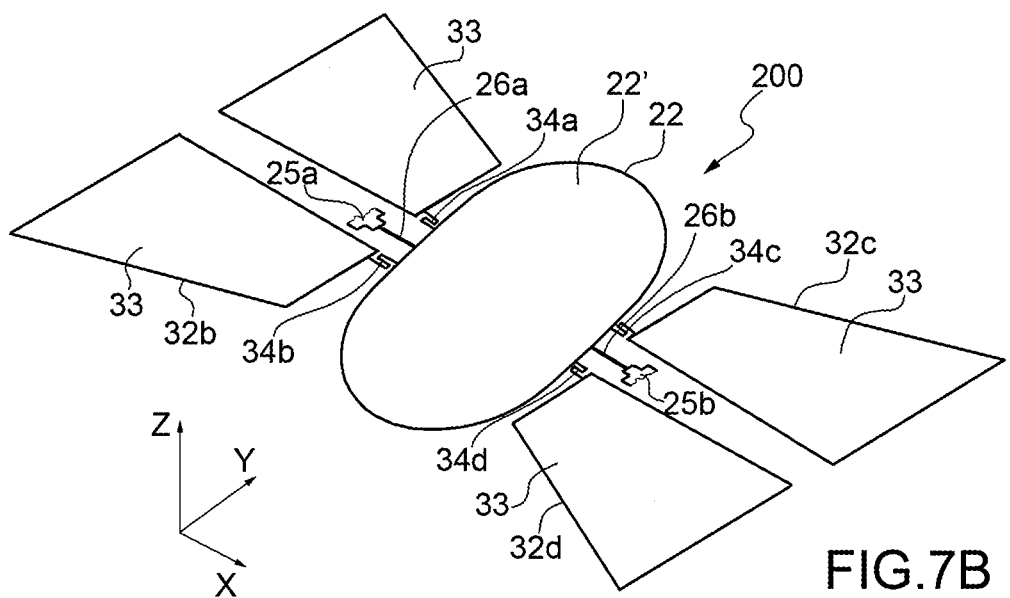
FIG. 7B is a schematic top view of the microelectromechanical mirror device of FIG. 6, according to an embodiment disclosed and described herein.

FIGS. 7A and 7B are schematic top views of the microelectromechanical mirror device 200 according to the present solution and, respectively, of the microelectromechanical mirror device 20 according to the known solution described in United States Patent Application Publication No. 20200192199 corresponding to European Patent Application No. 19165958.0. From a direct comparison of the aforesaid FIGS. 7A and 7B, the reduction in length of the driving arms 32a-32d, and the consequent reduction in the overall dimensions of the die 20', is evident.

Figure 8:
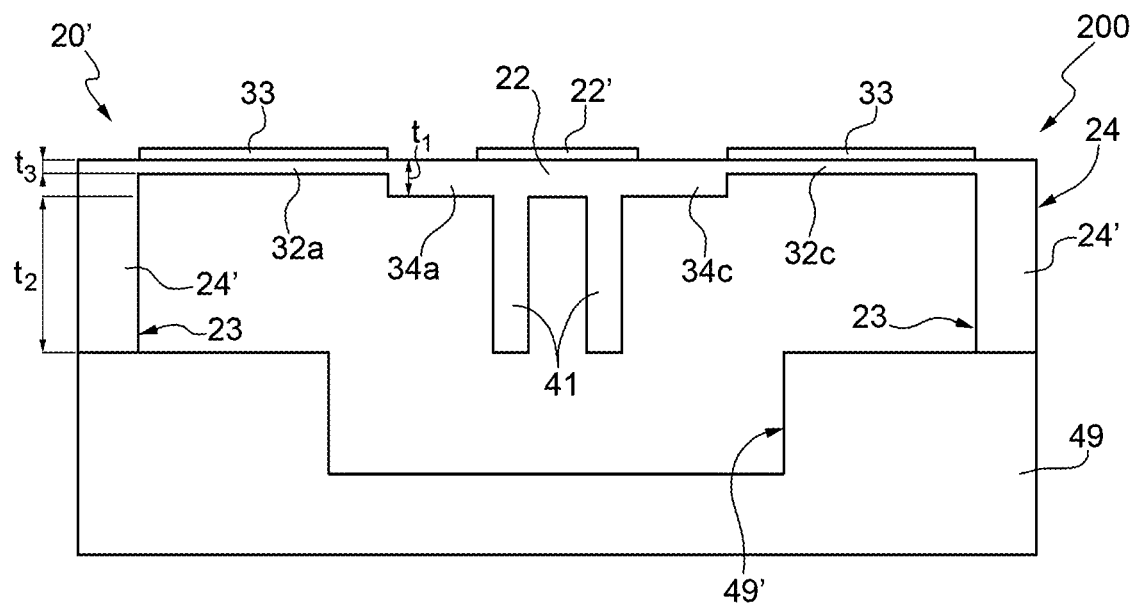
FIG. 8 is a schematic cross-sectional view of the microelectromechanical mirror device, according to a further aspect of the embodiment disclosed and described herein.

As illustrated schematically in FIG. 8, a supporting die 49 may moreover be coupled (via bonding) below the die 20' of the microelectromechanical mirror device 200; a recess 49' is defined in the supporting die 49, underneath the cavity 23 and in a position corresponding to the mobile structure 22, for allowing free rotation of the same mobile structure 22.

The advantages of the disclosed herein emerge clearly from the foregoing description.

In any case, it is once again underlined that the discloses herein, thanks to the choice of the different thicknesses of the elements constituting the microelectromechanical mirror device 200, allow the meeting simultaneously of the desired of robustness, in particular with respect to shocks along the orthogonal axis z, and the desires of efficiency, in particular with respect to the extent of displacements Δz that can be obtained by piezoelectric actuation.

In particular, provision of at least part of the elastic elements coupled to the tiltable structure 22 (for example, of at least the elastic suspension elements 26a, 26b) with the first thickness $t_1$ affords a desired robustness in regard to shocks. Provision of the reinforcement structure 41 with the second thickness $t_2$ affords desired characteristics of robustness and flatness of the tiltable structure 22. Moreover, provision of the driving arms 32a-32d of the actuation structure 30 with the third thickness $t_3$ affords the desired efficiency and range of movement of the tiltable structure 22 (for example, with a scanning angle of even as much as 12° and a displacement Δz of approximately 330 μm).

As mentioned previously, the descriptions herein may moreover enable a reduction in the occupation of area and/or in electrical power consumption as compared to traditional solutions.

Advantageously, the microelectromechanical mirror device 200 has good modal characteristics, with the first spurious mode, due to the out-of-plane movement of the tiltable structure 22, having a frequency (for example, higher than 3 kHz) much greater than that of the main mode (for example, equal to approximately 500 Hz).

In general, the disclosures herein enable exploitation of the advantages of piezoelectric actuation (i.e., use of low biasing voltages with a low energy consumption, allowing to obtain large displacements), at the same time having improved levels of mechanical and electrical performance as compared to known solutions.

Figure 9:
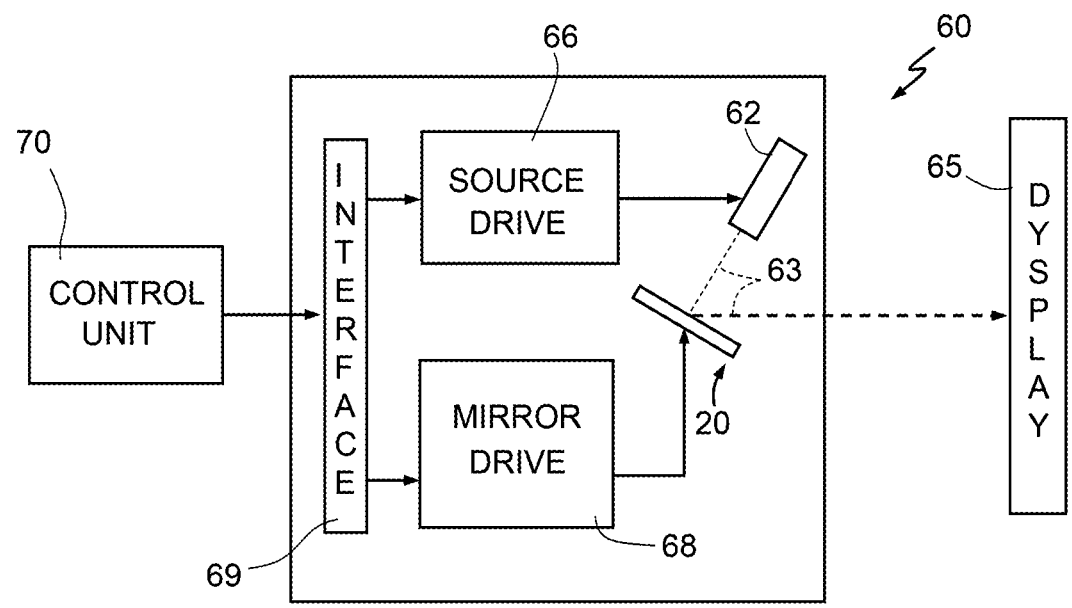
FIG. 9 is a block diagram of a picoprojector that uses the microelectronic mirror device disclosed and described herein.

Advantageously, the microelectromechanical mirror device 200 may be used in a picoprojector 60 configured to be operatively coupled to a portable electronic apparatus 61 (for example, a smartphone or augmented-reality smartglasses), as illustrated schematically with reference to FIG. 9.

In detail, the picoprojector 60 of FIG. 9 comprises: a light source 62, for example of a laser type, configured to generate a light beam 63; the microelectromechanical mirror device 200, acting as a mirror and configured to receive the light beam 63 and to direct it towards a screen or display surface 65 (external to and set at a distance from the picoprojector 60); a first driving circuit 66, configured to supply driving signals to the light source 62, for generation of the light beam 63 as a function of an image to be projected; a second driving circuit 68, configured to supply driving signals to the actuation structure 30 of the microelectronic mirror device 200; and a communication interface 69, configured to receive, by an external control unit 70, for example included in the portable apparatus 61, information on the image to be generated, for example in the form of a pixel array. This information is sent at input for driving the light source 62.

Finally, it is clear that modifications and variations may be made to what has been described and illustrated herein, without thereby departing from the scope, as defined in the appended claims.

Figure 1B:
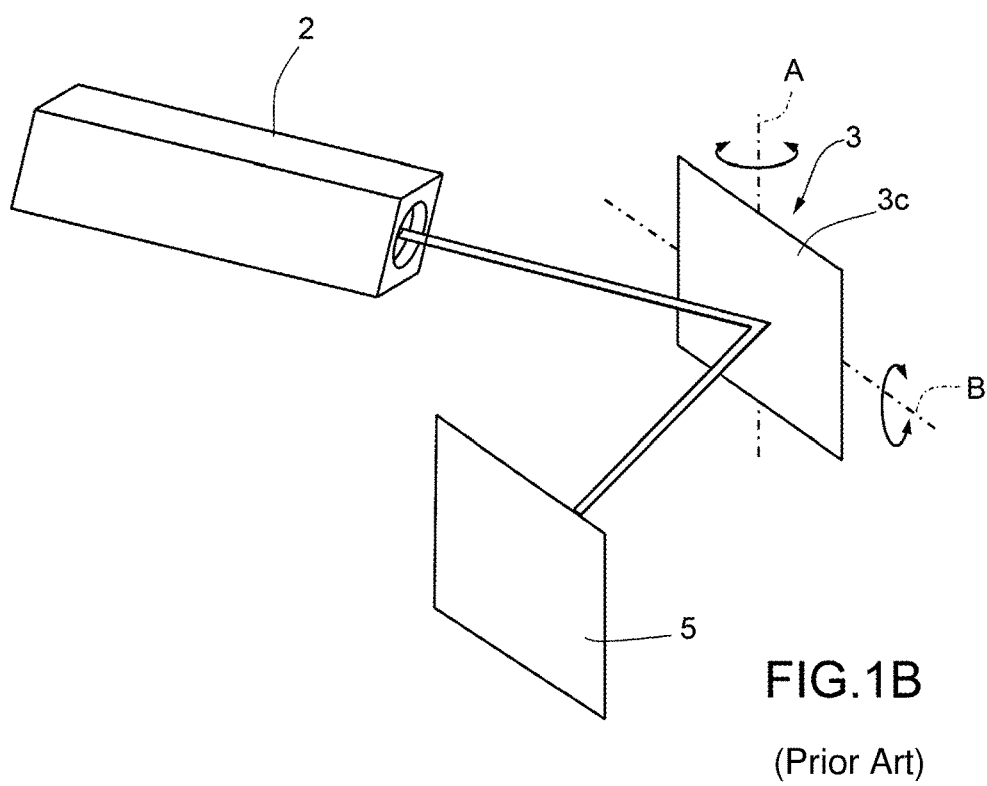
Figure 2A:
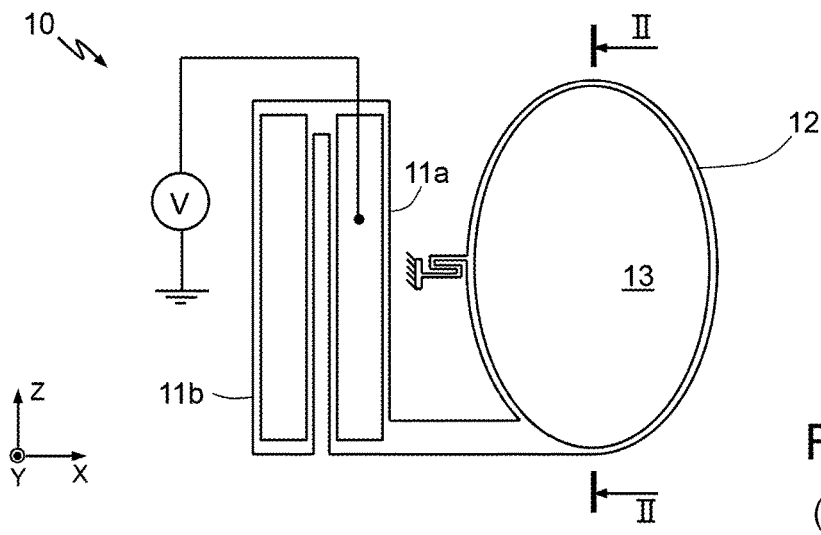
FIGS. 2A-2B show a portion of a mirror device with piezoelectric actuation of a known type in a schematic top view and in a schematic cross-sectional view, respectively.
Figure 2B:
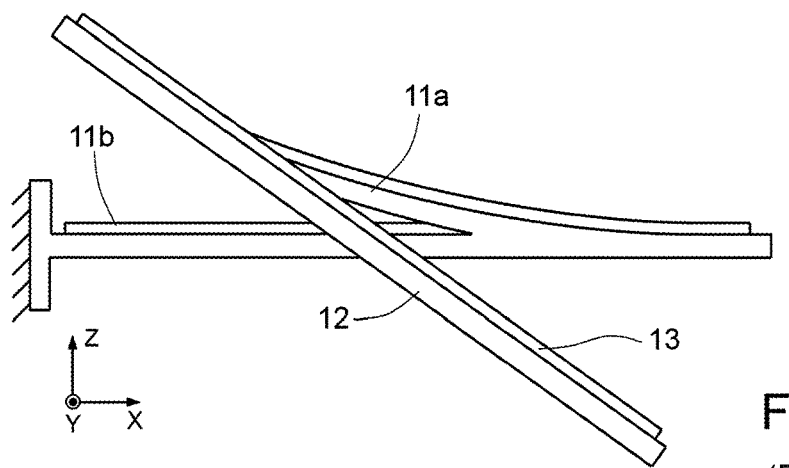

In particular, this disclosure may also be applied in the case of a biaxial version of the microelectromechanical mirror device 200 (in a way similar to what has been described in detail in the aforesaid United States Patent Application Publication No. 20200192199 corresponding to European Patent Application No. 19165958.0), i.e., in the case where the tiltable structure 22 is configured to perform movements of rotation both about the first axis of rotation (coinciding with the first median axis of symmetry X, parallel to the first horizontal axis x) and about a second axis of rotation (coinciding with the second median axis of symmetry Y, parallel to the second horizontal axis y; the second axis of rotation corresponds, for example, to the first axis of rotation A of a picoprojector apparatus, see for instance FIG. 1B).

Furthermore, variants regarding the shape of the elements forming the microelectromechanical mirror device 200 may in general be envisaged, for example different shapes of the tiltable structure 22 (and of the corresponding reflecting surface 22'), or different shapes and/or arrangements of the driving arms 32a-32d. For instance, as also described in the aforesaid United States Patent Application Publication No. 20200192199 corresponding to European Patent Application No. 19165958.0, the driving arms 32a-32d may have a main extension parallel to the second horizontal axis y of the horizontal plane xy, or else just one pair of driving arms may be provided, elastically coupled to the tiltable structure 22 (once again as described in the aforesaid United States Patent Application Publication No. 20200192199 corresponding to European Patent Application No. 19165958.0).

In addition, further elastic structures (springs) could be present in order to help optimize the sensitivity of the piezoresistive sensor 39 (and also these elastic structures could have the third thickness $t_3$).

The invention claimed is:

1. A microelectromechanical systems (MEMS) mirror device, comprising:
a fixed structure defining a cavity;
a tiltable structure carrying a reflecting surface, wherein the tiltable structure is elastically suspended above the cavity and has a main extension in a horizontal plane;
elastic elements coupled to said tiltable structure; and
at least one first pair of driving arms carrying respective regions of piezoelectric material to be biased to cause rotation of the tiltable structure about a first axis of rotation parallel to a first horizontal axis of said horizontal plane, said at least one first pair of driving arms being elastically coupled to the tiltable structure and interposed between the tiltable structure and the fixed structure;
wherein said at least one first pair of driving arms have, along an orthogonal axis transverse to said horizontal plane, a thickness smaller than a thickness of at least some of the elastic elements coupled to said tiltable structure;
wherein said fixed structure defines, in the horizontal plane, a frame that delimits and surrounds said cavity, and wherein said fixed structure further has a first supporting element and a second supporting element which extend longitudinally along said first axis of rotation within the cavity starting from said frame, on opposite sides of said tiltable structure; and
wherein said elastic elements extend between said tiltable structure and said first and second supporting elements.

2. The MEMS mirror device according to claim 1, wherein at least some of the elastic elements have a first thickness; wherein said fixed structure has a thickness greater than said first thickness by a value equal to a second thickness; wherein said at least one first pair of driving arms have a third thickness along said orthogonal axis; and wherein said third thickness is smaller than said first thickness, and wherein said second thickness is greater than said first thickness.

3. The MEMS mirror device according to claim 2, wherein the first thickness is comprised between 10 μm and 50 μm; wherein the third thickness is less than 20 μm; and wherein the second thickness is greater than 50 μm.

4. The MEMS mirror device according to claim 2, wherein said tiltable structure has a reinforcement structure located on a surface of the tiltable structure opposite to the reflecting surface, and functioning to provide mechanical reinforcement, said reinforcement structure having said second thickness along said orthogonal axis.

5. The MEMS mirror device according to claim 2, wherein said tiltable structure has said first thickness along said orthogonal axis.

6. The MEMS mirror device according to claim 2, wherein said tiltable structure has said third thickness along said orthogonal axis.

7. The MEMS mirror device according to claim 2, wherein said first, second, and third thicknesses are defined in a same die of semiconductor material.

8. The MEMS mirror device according to claim 2, wherein remaining elastic elements coupled to said tiltable structure, different from said at least some of the elastic elements, have said third thickness.

9. The MEMS mirror device according to claim 2, wherein all the elastic elements coupled to said tiltable structure have said first thickness.

10. The MEMS mirror device according to claim 1, wherein said elastic elements comprise:
elastic decoupling elements coupling said tiltable structure to said at least one first pair of driving arms on opposite sides and in proximity of the first axis of rotation and which are rigid with respect to movement out of the horizontal plane and which are compliant to torsion about an axis parallel to said first axis of rotation; and
elastic suspension elements elastically coupling said tiltable structure to said fixed structure at said first axis of rotation and which are rigid with respect to movement out of the horizontal plane and which are compliant to torsion about said first axis of rotation, wherein said elastic suspension elements extend along said first axis of rotation between a central portion of opposite sides of the tiltable structure and said fixed structure.

11. The MEMS mirror device according to claim 10, wherein said elastic decoupling elements are coupled to said tiltable structure at said first axis of rotation; and wherein said at least one first pair of driving arms have a first end elastically coupled to said tiltable structure by said elastic decoupling elements and a second end, longitudinally opposite to said first end, fixedly coupled to said fixed structure.

12. The MEMS mirror device according to claim 10, further comprising a second pair of driving arms arranged in a way symmetrical to the first pair of driving arms with respect to a second horizontal axis of said horizontal plane and orthogonal to said first horizontal axis; said driving arms of said second pair of driving arms carrying respective regions of piezoelectric material and being elastically coupled to the tiltable structure on opposite sides and in proximity of the first axis of rotation by said elastic decoupling elements, said driving arms being rigid with respect to movement out of the horizontal plane and compliant to torsion about said first axis of rotation.

13. A picoprojector apparatus, comprising:
a microelectromechanical mirror device comprising:
a fixed structure defining a cavity;
a tiltable structure carrying a reflecting surface, said tiltable structure being elastically suspended above the cavity and having a main extension in a horizontal plane;
elastic elements coupled to said tiltable structure; and
at least one first pair of driving arms carrying respective regions of piezoelectric material to be biased to cause rotation of the tiltable structure about a first axis of rotation parallel to a first horizontal axis of said horizontal plane, said at least one first pair of driving arms being elastically coupled to the tiltable structure and interposed between the tiltable structure and the fixed structure;
said at least one first pair of driving arms having, along an orthogonal axis transverse to said horizontal plane, a thickness smaller than a thickness of at least some of the elastic elements coupled to said tiltable structure;
wherein said fixed structure defines, in the horizontal plane, a frame that delimits and surrounds said cavity, and wherein said fixed structure further has a first supporting element and a second supporting element which extend longitudinally along said first axis of rotation within the cavity starting from said frame, on opposite sides of said tiltable structure; and wherein said elastic elements extend between said tiltable structure and said first and second supporting elements.

14. The picoprojector apparatus according to claim 13, further comprising:
a light source operable for generating a light beam to be directed at the microelectromechanical mirror device as a function of an image to be generated; and
a driving circuit configured to provide electrical driving signals for causing rotation of said tiltable structure of the microelectromechanical mirror device.

15. The picoprojector apparatus according to claim 13, wherein at least some of the elastic elements have a first thickness; wherein said fixed structure has a thickness greater than said first thickness by a value equal to a second thickness; wherein said at least one first pair of driving arms have a third thickness along said orthogonal axis; and wherein said third thickness is smaller than said first thickness, and wherein said second thickness is greater than said first thickness.

16. The picoprojector apparatus according to claim 15, wherein said tiltable structure has a reinforcement structure located on a surface of the tiltable structure opposite to the reflecting surface, and functioning to provide mechanical reinforcement, said reinforcement structure having said second thickness along said orthogonal axis.

17. The picoprojector apparatus according to claim 15, wherein said tiltable structure has said first thickness along said orthogonal axis.

18. The picoprojector apparatus according to claim 15, wherein said tiltable structure has said third thickness along said orthogonal axis.

19. The picoprojector apparatus according to claim 15, wherein said first, second, and third thicknesses are defined in a same die of semiconductor material.

20. The picoprojector apparatus according to claim 15, wherein remaining elastic elements coupled to said tiltable structure, different from said at least some of the elastic elements, have said third thickness.

21. The picoprojector apparatus according to claim 15, wherein all the elastic elements coupled to said tiltable structure have said first thickness.

* * * * *